United States Patent [19]

Lampe et al.

[11] 3,846,820

[45] Nov. 5, 1974

[54] MOSAIC FOR IR IMAGING USING PYROELECTRIC SENSORS IN A BIPOLAR TRANSISTOR ARRAY

[75] Inventors: Donald R. Lampe, Ellicott City; Edgar L. Irwin, Glen Burnie, both of Md.

[73] Assignee: Westinghouse Electric Corporation, Pittsburgh, Pa.

[22] Filed: June 26, 1973

[21] Appl. No.: 373,725

[52] U.S. Cl. ........................ 357/31, 357/32, 357/30, 178/7.1, 178/DIG. 8, 250/334, 250/338, 250/332

[51] Int. Cl. .............................................. H01l 17/00

[58] Field of Search ........ 178/7.1, DIG. 8; 340/166; 250/338, 334, 332; 317/235 NA

[56] References Cited

UNITED STATES PATENTS

| | | | |
|---|---|---|---|
| 3,445,589 | 5/1969 | Taylor | 178/7.1 |
| 3,470,318 | 9/1969 | Webb | 178/7.1 |
| 3,562,418 | 2/1971 | Glusick | 178/6 |
| 3,707,695 | 12/1972 | Yamaka | 338/18 |
| 3,772,518 | 11/1973 | Murayama | 250/211 R |
| 3,774,043 | 11/1973 | La Carvennec | 250/330 |

*Primary Examiner*—Martin H. Edlow
*Attorney, Agent, or Firm*—D. Schron

[57] ABSTRACT

A monolithic integrated circuit for a bipolar transistor array of pyroelectric sensors to provide a spectral response to incident IR radiation. A matrix is provided by rows and columns of the sensors formed in a semiconductive substrate. Spaced parallel collector diffusions in the substrate are of one type conductivity which, in turn, receive base region diffusions of the other type conductivity thus forming a P-N junction. Pyroelectric thin films are deposited as isolated regions above the collector regions. In one form, the pyroelectric film has edge electrodes each extending to one of the underlying base and collector regions which are electrically insulated from the film by an oxide layer. An alternative to this form provides that the film is thermally insulated by an air gap from the collector regions. In a second alternative form, a surface electrode is used wherein the pyroelectric film is deposited directly on the collector and the surface electrode overlies the film and joins with the diffused base region. Emitter electrodes extend transverse to the orthogonal arrangement of the diffused collector and base regions. The emitter electrodes have a diffused contact region into one of the regions formed by the P-N junction for applying a reverse-biased charge to the junction. The pyroelectric charge neutralizes this reverse bias and the video signal is a measure of the current surge needed to restore the charge on the reverse-biased junction.

11 Claims, 5 Drawing Figures

MOSAIC FOR IR IMAGING USING PYROELECTRIC SENSORS IN A BIPOLAR TRANSISTOR ARRAY

BACKGROUND OF THE INVENTION

This invention provides a novel application of thin pyroelectric film capacitors to mosaics of bipolar transistors to yield a new composite mosaic with a spectral response in the IR (Infra Red) range such that fabrication is compatible with integrated circuit technology and the complete mosaic is still capable of high speed IR sensing without cryogenic cooling. The actual IR detection is accomplished by pyroelectric film and the transistors are structured for integrating the pyroelectric charge to yield the video signal when interrogated.

In the past, optical images have been converted into electrical video signals through the use of an electron-optics device such as an orthicon or vidicon wherein light is focused onto a photosensitive surface. By scanning the photosensitive surface with an electron beam, the electrical video signal is produced which can be transmitted to a receiving tube where the image is reproduced in another electron-optics device.

Recently, solid-state television camera systems have been developed which are much more rugged than the conventional type. They can be readily miniaturized by integrated circuit techniques and require much less power than conventional type of camera tubes. Such devices comprise a monolithic semiconductive wafer having a plurality of phototransistors formed therein. The phototransistors can be arranged in horizontally-spaced columns with the emitters in each column interconnected, and in the vertical spaced rows with the collectors in each row interconnected. Scanning an image focused onto the mosaic in the horizontal direction is achieved by sequentially connecting the emitters for the respective rows to ground; while scanning in the vertical direction at a much lower frequency is achieved by sequentially connecting the collectors in the respective rows to a source of driving potential. One form of such a solid-state camera device is illustrated in U.S. Pat. No. 3,470,317 which issued on Sept. 30, 1969 to the Administrator of the National Aeronautics and Space Administration.

These imaging devices generally perform the task of converting a pattern of incident radiation falling upon the surface of the sensor into an electrical signal. The phototransistors respond to the rate of photon impingement upon their surface and generally they may be arranged to function electrically in two modes. In one mode, each elemental device in the array senses the incident radiation only while it is undergoing interrogation, this results in a very poor sensitivity and an array that is of value primarily only where very high light radiation levels are available.

The second mode of operation relates to charge storage or photon flux integration where incident radiation continuously generates charges that are stored within capacitors at each array element. This charge tends to neutralize that charge already on the plates of the capacitor, thereby reducing the voltage across the capacitor below a fixed voltage that is restored to the capacitor during each read-out period. In this manner, the video output signal is the transient surge needed to restore each elemental capacitor to the fixed voltage.

Presently, this is realized by observing the effect of photogenerated carriers upon the reverse-biased base-collector junction of the transistor structure during the frame time between scans. Consequently, present devices that are compatible with integrated circuit technology generally respond to radiation in the visible light region with the upper wavelength sensitivity of silicon devices limited to about 1.1 micrometers ($10^{-6}$meters) and of germanium to about 1.8 micrometers unless cryogenic cooling to 25° K is used.

In other words, for visible light, the base-collector junction of each phototransistor in the existing mosaic performs two functions simultaneously, namely, they generate charged carriers in proportion to the intensity of the incident visible photons; and secondly, they collect the light-generated charge in the capacitance of the reverse-biased junction.

SUMMARY OF THE INVENTION

As an overall object, the present invention seeks to provide an integrated matrix array of pyroelectric sensors responsive to incident IR radiation using integrated circuit technology for thermal IR imaging at existing TV scan rates. The invention is particularly useful for imaging IR wavelengths of 3–5 micrometers and up to 8–14 micrometers.

More specifically, an object of the present invention is to provide a spectral response for existing mosaics of bipolar transistor arrays into the far IR region by means of a simple element whose fabrication is compatible with integrated circuit technology wherein a passive element in the form of a thin pyroelectric film capacitor performs the task of generating pyroelectric charges in proportion to the incident thermal IR radiation in an effective manner, and at an acceptable response rate, while the device is at room temperature.

In accordance with the present invention, there is provided an integrated bipolar transistor array of pyroelectric sensors responsive to incident IR radiation, the sensors being arranged in a plurality of rows and columns, thereby forming a matrix. The sensors comprise a substrate of semiconductive material, spaced orthogonal collector regions of one type conductivity diffused into the substrate, a base region of the other type conductivity diffused into the collector regions to form a P-N junction with the collector, a pyroelectric thin-film means deposited as isolated regions on the spaced orthogonal collector regions to thereby form a matrix of pyroelectric sensors, at least one electrode for joining a surface on each isolated region of the thin-film means to the respective underlying base region such that the opposing surface of the respective film means is conductively joined to the collector, and emitter electrodes with a diffused contact into a region of one material forming the P-N junction and extending transverse to the orthogonal arrangement of the collector and base regions to thereby apply a reverse-biased charge to the P-N junction incident to a column and row interrogation of the depleted charge on the P-N junction.

In one form, the opposite edges of the pyroelectric film are provided with electrodes. One of the electrodes is connected to the diffused collector region, while the other electrode is joined to the diffused base region. In a second form, the pyroelectric film is deposited directly upon the diffused collector region and a face electrode is deposited upon the exposed surface of the pyroelectric film and joined with the diffused base region. In a third form, the pyroelectric film is supported upon an insulation layer with an underlying air gap to thermally and electrically isolate the pyroelectric film from the orthogonal collector-base regions except for electrical interconnection thereto.

These features and advantages of the present invention as well as others will be more apparent when the following description is read in light of the accompanying drawings, in which.

As indicated hereinbefore, the present invention relates to extending the spectral response of mosaics of bipolar transistor arrays into the far IR region, e.g., 10 micrometers by means of a monolithic integrated bipolar transistor array of pyroelectric sensors whose fabrication is compatible with integrated circuit technology. The completed IR sensitive mosaic can detect very fast changes in radiation levels and does not require cryogenic cooling. Thus, it is usable for thermal IR imaging at existing TV scan rates. The passive element as discussed in greater detail hereinafter is a thin-pyroelectric film capacitor which performs the task of generating pyroelectric charges in proportion to the incident thermal IR radiation which is a function that the common photodiode is unable to effectively accomplish with reasonably expected speed at room temperature. The IR generated pyroelectric charge is accumulated in the capacitance of the reverse-biased base-collector junction of transistors in the mosaic. These transistors no longer convert the incident radiation into electrical form but instead they are used merely to integrate the pyroelectric signal from one read-out pulse to the next. The mechanism for transforming the incident IR radiation into pyroelectric signals will now be briefly explained. It should be noted, however, that it is not photon generation of charged carriers.

Radiation incident to the thin-pyroelectric film is absorbed and then converted into heat that tends to raise the temperature of the pyroelectric material. The pyroelectric film has a spontaneous polarization which depends upon its temperature. Thus, the pyroelectric transforms increments of incident radiation into increments of spontaneous polarization and consequently into increments of charge on the plates of the thin-pyroelectric film capacitors at each mosaic element. Since the charge on the capacitor is given by the expression:

$$\int_A^{P_s} \cdot dA$$

where $P_s$ is the temperature dependent spontaneous polarization vector. It will be observed, therefore, that the video signal is merely the current surge needed to restore that charge on the base-collector capacitor which was neutralized by the pyroelectric charge. An analysis of the aforementioned phototransistor while operating in the integration mode has been shown to give an output voltage generally equal to the ratio of:

$$Q/C_{BC}$$

where Q is equal to the charge generated by light plus leakage, and $C_{BC}$ is equal to the base-collector junction depletion layer capacitance. Thus, it is seen that the mosaic sensor according to the present invention posseses an important advantage since the output voltage is independent of the transistor beta which is bound to vary among phototransistor elements.

Figure 1:
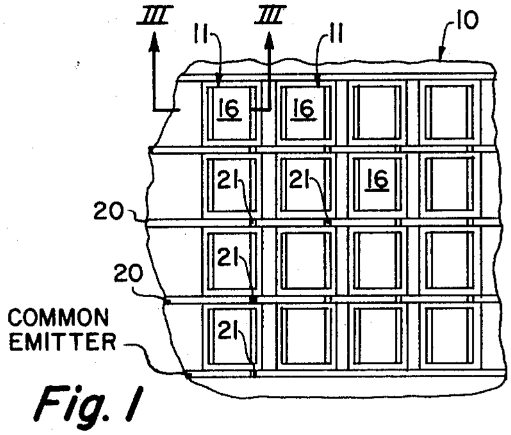
FIG. 1 is a matrix array of pyroelectric sensors according to the present invention.

With reference now to FIG. 1 of the drawings, there is illustrated a four-by-four matrix mosaic of pyroelectric sensors which are fabricated using integrated circuit technology to form a monolithic integrated circuit on a suitably chosen substrate 10. While mosaic array illustrated includes a four-by-four matrix of sensors, those skilled in the art will readily understand that an *n*-by-*n* array can be fabricated using the teachings of the present invention. As indicated, the array consists of a four-by-four arrangement of pyroelectric sensors 11 the columns of which overlie orthogonal collector regions with diffused base regions forming a P-N junction that is, in turn, diffused in the substrate.

Figure 2:
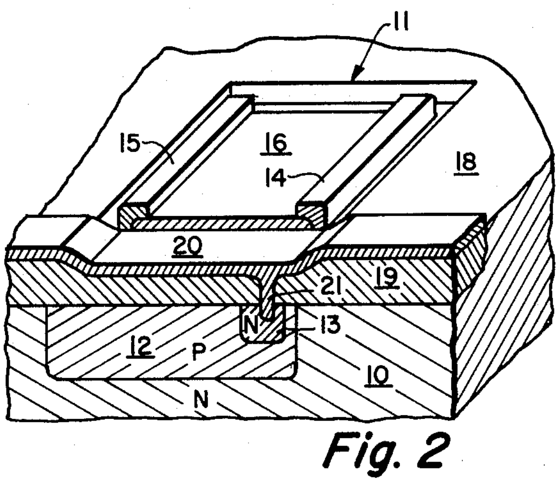
FIG. 2 is a perspective view, partly in section, of one of the sensors shown in FIG. 1.
Figure 3:
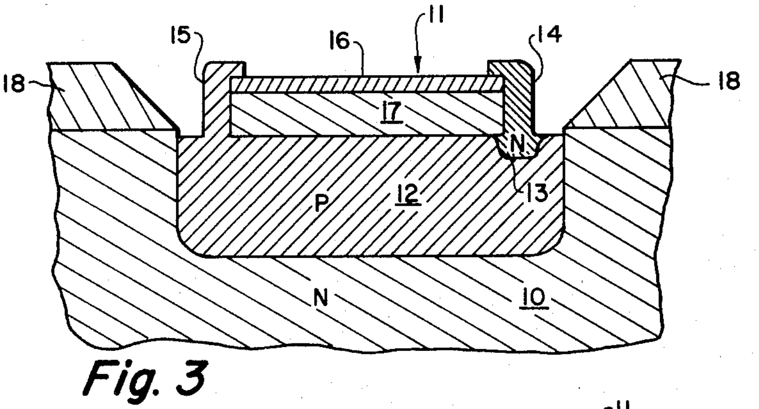
FIG. 3 is a sectional view taken along line III—III of FIG. 1.

As best shown in FIGS. 2 and 3, the substrate 10 is made of a semiconductive material such as silicon. An orthogonal-shaped collector 12 is in the form of a diffused P-type material. A base 13 of N-type material is diffused into the collector along one longitudinal edge thereof. Projecting from the diffused base 13 is an edge electrode 14 extending in the direction of the column. An edge electrode 15 extends in the same direction but it is spaced on the opposed edge of the collector and connected thereto. Extending between the electrodes and in contact therewith is a thin-film of pyroelectric material 16 deposited upon the surface of an oxide bridge 17 with an air gap to isolate the film thermally from the substrate and electrically from the diffused collector. A layer of oxide 18 formed on the surface of the substrate forms an isolation barrier between a pyroelectric sensor in one column and a pyroelectric sensor in an adjacent column. Between the sensors in each column, layers of insulating material 19 are grown such as $SiO_2$ which support on the upper surface thereto metalized electrode leads 20 forming a common emitter. The emitters in each row include a diffused portion at 21 (FIGS. 1 and 2) extending through the insulation layer 19 and into contact with the base material 13. In this manner, each pyroelectric sensor can be interrogated using an emitter from one row and a collector from one column. A general form of circuitry used for interrogating electrical charges from sensors in rows and columns of an array is described in the aforementioned U.S. Pat. No. 3,470,318.

As indicated previously, the video signal is the current surge needed to restore that charge on the base-collector capacitor which was neutralized by the pyroelectric charge. In other words, the P-N junction formed by the collector 12 and the base 13 for each sensor first undergoes a reverse bias to form an increased depletion region at the semiconductor dielectric interface of the P-N junction. This charge is then neutralized by the pyroelectric charge.

Figure 4:
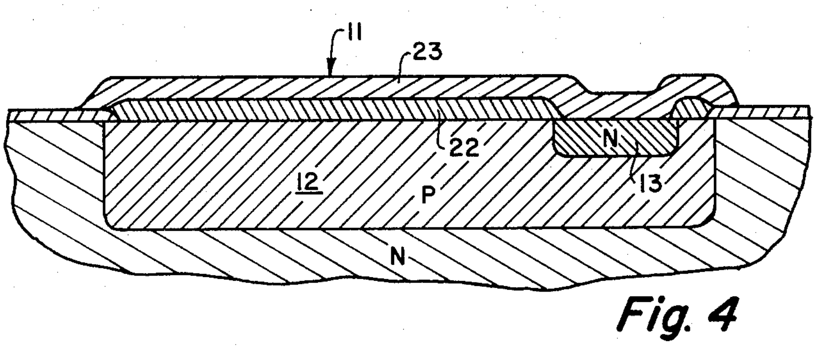
FIG. 4 is a sectional view similar to FIG. 3 but illustrating a second form of the present invention.

FIG. 4 illustrates a second embodiment of the present invention which differs from that described in regard to FIGS. 1, 2 and 3 only in respect to the electrode arrangement used for delivering the neutralizing charge from the pyroelectric material to the reverse-biased P-N junction. In this embodiment, a thin-film of pyroelectric material 22 is deposited directly upon the exposed surface of the common collector 12. After the pyroelectric film has been formed, there is deposited on the exposed surface of the film a base electrode 23 of material such as silicon or germanium. The base electrode is insulated by the pyroelectric film from the common collector but in contact with the base diffusion layer 13. In this manner, the pyroelectric charge is applied to the collector and base for neutralizing the charge stored by the reverse bias stored at the P-N junction.

Figure 5:
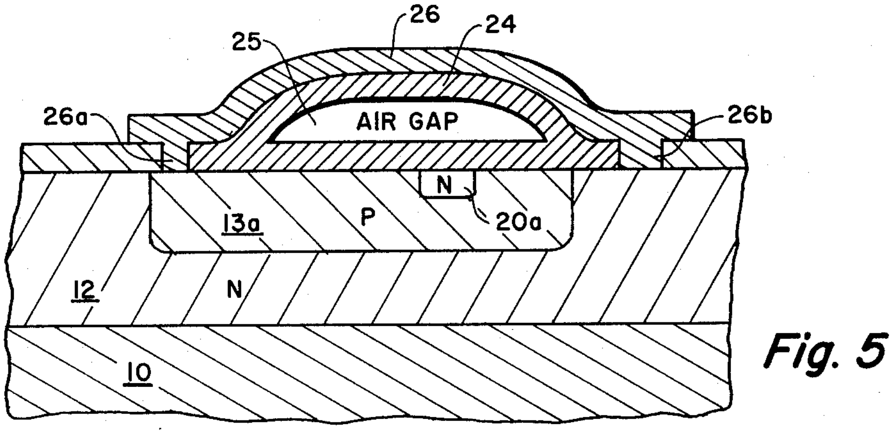
FIG. 5 is a sectional view similar to FIGS. 3 and 4 but illustrating a third form of the present invention.

FIG. 5 illustrates a third embodiment of the present invention which differs in its essential aspect from that described in regard to FIGS. 1, 2, 3 and 4 by the employment of an insulation bridge with an air gap to isolate a pyroelectric film thermally from the substrate and electrically from the diffused reverse-biased P-N junction. As shown in FIG. 5, the substrate 10 supports the collector 12 of N-type material with a diffused base 13*a* of P-type material. A diffused emitter 20*a* is formed in the base 13*a*. An insulation layer, e.g., $SiO_2$, is deposited on the substrate after the array of transistors have been formed. A photo-engraved aluminum pad is then covered with a further insulation layer to form an insulation bridge 24. An air gap 25 underlies an insulation layer of the bridge. The air gap is produced by removing the aforesaid aluminum pad by means such as chemical etching through a pad removal window (not shown). A pyroelectric film 26 is deposited upon the upper surface of insulation bridge 24. The film 26 includes electrodes 26*a* and 26*b* extending beyond the bridge 24 to a point where they are joined electrically to the base 13*a* and collector 12 respectively. The use of the bridge 24 with the air gap 25 isolates the pyroelectric film 26 thermally as well as electrically from the underlying regions thereby providing better sensitivity or speed of response of the array. Thus, thermal experience of the array is limited to radiation and convection by the electrodes 26*a* and 26*b*.

The actual material selected to form the pyroelectric film may be of material such as bismuth titanate or barium strontium niobate.

Although the invention has been shown in connection with certain specific embodiments, it will be readily apparent to those skilled in the art that various changes in form and arrangement of parts may be made to suit requirements without departing from the spirit and scope of the invention.

What is claimed is:

1. An integrated array of pyroelectric sensors responsive to incident IR radiation comprising:

a plurality of pyroelectric sensors arranged in the form of a column such that a plurality of said columns defines an array of said sensors each for thermal transformation of incident IR radiation into an electrical charge proportional thereto;

an integrated circuit supporting said sensors including a reverse-biased P-N junction for integration of said electrical charge from each of said pyroelectric sensors; and emitter means electrically joined to one member forming said P-N junction for detecting the integrated electrical charge stored by said reverse-biased P-N junction.

2. The integrated array of pyroelectric sensors according to claim 1 wherein each of said pyroelectric sensors include a thin film deposit of pyroelectric material and an electrode electrically joined to each member forming said P-N junction for contacting one of two opposed surfaces of said pyroelectric material.

3. The integrated array of pyroelectric sensors according to claim 2 wherein said pyroelectric deposit includes a thin film of bismuth titanate.

4. The integrated array of pyroelectric sensors according to claim 2 wherein said pyroelectric deposit includes a thin film of barium strontium niobate.

5. An integrated bipolar array of pyroelectric sensors responsive to incident IR radiation, said sensors being arranged as a plurality of rows and columns thereby forming a matrix, said pyroelectric sensors comprising:

a substrate of semiconductive material, spaced orthogonal collector regions of one type conductivity diffused into said substrate, a base region of the other type conductivity diffused into said collector regions to form a P-N junction therewith, pyroelectric film means formed as separate regions overlying each one of said spaced orthogonal collector regions to thereby form a matrix of pyroelectric sensors, an electrode for joining a surface on said pyroelectric film means to an underlying base region such that the opposing surface of the film means is conductively joined to a collector region, and emitter electrode conductively joined to one diffusion forming said P-N junction, said emitter electrode extending transversely to the orthogonal arrangement of said collector and said base.

6. The pyroelectric sensors according to claim 5 further comprising an oxide of said substrate for forming an insulation barrier between adjacent ones of said pyroelectric thin film means.

7. The pyroelectric sensors according to claim 5 wherein said electrode for joining a surface on said pyroelectric film means includes a first edge electrode extending along one edge of said film means and a second edge electrode extending along an edge of said film means opposed to the said first electrode.

8. The pyroelectric sensors according to claim 5 wherein said regions of said pyroelectric film are deposited upon said collector region, and said electrode for joining a surface on said pyroelectric film means includes a surface electrode deposited on the exposed face surface of each region of said film.

9. The pyroelectric sensors according to claim 5 wherein said emitter electrodes include a diffusion extending into one of said diffusions forming said P-N junction.

10. The pyroelectric sensors according to claim 9 wherein said emitter electrode is further defined to include a diffusion extending into said base diffusion.

11. The pyroelectric sensors according to claim 5 further comprising an insulation bridge including an air gap to isolate said pyroelectric thin film means thermally from said substrate and electrically from said collector regions.

* * * * *